(12) United States Patent
Mizunaga et al.

(10) Patent No.: US 8,858,710 B2
(45) Date of Patent: Oct. 14, 2014

(54) CHEMICAL SOLUTION VAPORIZING TANK AND CHEMICAL SOLUTION TREATING SYSTEM

(75) Inventors: Kouichi Mizunaga, Koshi (JP); Hiroyuki Kudoh, Koshi (JP); Kazuhiko Ooshima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1706 days.

(21) Appl. No.: 12/216,992

(22) Filed: Jul. 14, 2008

(65) Prior Publication Data

US 2009/0020072 A1 Jan. 22, 2009

(30) Foreign Application Priority Data

Jul. 20, 2007 (JP) ................................. 2007-189975

(51) Int. Cl.
C23C 16/00 (2006.01)
C23C 16/455 (2006.01)
C23C 16/448 (2006.01)
H01L 21/67 (2006.01)

(52) U.S. Cl.
CPC ................................ *H01L 21/67017* (2013.01)
USPC ............ 118/715; 118/712; 118/719; 118/726

(58) Field of Classification Search
CPC ............... C23C 16/448; C23C 16/4481; C23C 16/4482; C23C 16/4483; C23C 16/4485; H01L 21/67017
USPC ................... 118/715, 712, 719, 726
See application file for complete search history.

(56) References Cited

U.S. PATENT DOCUMENTS

| 5,803,938 | A | * | 9/1998 | Yamaguchi et al. | 261/130 |
|---|---|---|---|---|---|
| 6,053,643 | A | * | 4/2000 | Tanahashi et al. | 396/626 |
| 6,905,541 | B2 | * | 6/2005 | Chen et al. | 117/86 |
| 2002/0078894 | A1 | * | 6/2002 | Timmons et al. | 118/726 |
| 2003/0217697 | A1 | * | 11/2003 | Miyamoto et al. | 118/715 |
| 2007/0181703 | A1 | * | 8/2007 | Buchanan et al. | 237/58 |
| 2008/0173240 | A1 | * | 7/2008 | Furukawahara et al. | 118/726 |
| 2009/0266234 | A1 | * | 10/2009 | Ahman et al. | 95/286 |

FOREIGN PATENT DOCUMENTS

| JP | 60-10674 | | 4/1985 |
|---|---|---|---|
| JP | 5-102024 | | 4/1993 |
| JP | 7-34936 | | 8/1995 |
| JP | 07-034936 | * | 8/1995 |
| JP | 8-78351 | | 3/1996 |
| JP | 11-347476 | * | 12/1999 |
| WO | WO 2007/073277 | * | 6/2007 |

* cited by examiner

*Primary Examiner* — Jeffrie R Lund
*Assistant Examiner* — Satish Chandra
(74) *Attorney, Agent, or Firm* — Smith, Gambrell & Russell LLP

(57) ABSTRACT

An object is to suppress differences in concentration between processing gases supplied to a plurality of works in a chemical solution vaporizing tank. The chemical solution vaporizing tank includes a tank body having a plurality of vaporizing chambers formed by laterally and airtightly partitioning an internal space of the tank body, a chemical solution passage located under a liquid level in each vaporizing chamber and formed at each partition member for passing the chemical solution between the vaporizing chambers, and a gas passage located above the liquid level in each vaporizing chamber and formed at the partition member to communicate the vaporizing chambers with each other for uniformizing pressures in the respective vaporizing chambers. A quantity of the channel layer in each vaporizing chamber is controlled by managing, e.g., the liquid level.

13 Claims, 11 Drawing Sheets

FIG.11

CHEMICAL SOLUTION VAPORIZING TANK AND CHEMICAL SOLUTION TREATING SYSTEM

BACKGROUND OF THE INVENTION

1. Field of the Invention

The present invention relates to a chemical solution vaporizing tank and a chemical solution processing system for producing a processing gas by supplying a vaporization gas (i.e., a gas for vaporization) to a stored chemical solution and supplying the processing gas to a work for processing it.

2. Description of the Background Art

In a photoresist step that is one of semiconductor manufacturing steps, a resist pattern is formed by applying resist over a surface of a semiconductor wafer that is a substrate (and will be referred to as a "wafer" hereinafter), exposing the resist with a predetermined pattern and then developing it. This processing is generally performed with a system in which an exposing device is connected to a coating and developing device performing the coating and development of the resist.

The coating and developing devices may be provided with various liquid processing devices that perform processing by supplying a chemical solution to substrates. For example, the liquid processing device is formed of a chemical solution vaporizing tank for vaporizing the processing chemical solution, and a processing module that forms a processing space accommodating a wafer and processes it by supplying the vaporized processing chemical solution. More specifically, as an example of the liquid processing device, there is a hydrophobic processing system that performs hydrophobic processing on a wafer before applying resist for the purpose of improving adhesion of the resist to the wafer. This hydrophobic processing system includes an HMDS solution vaporizing tank for vaporizing an HMDS (HexaMethylDiSilazane) solution, and a hydrophobic processing module performing the processing by supplying the HMDS gas to the wafer. The liquid level of the HMDS solution in the tank is managed to fall within a predetermined range, vaporization efficiency is controlled to fall within a predetermined range and an HMDS gas within a predetermined concentration range is supplied to the hydrophobic processing module. Usually, the coating and developing device is provided with the plurality of such hydrophobic processing modules for improving a throughput, and the chemical solution vaporizing tanks already described are individually arranged for the respective hydrophobic processing modules.

As a time elapses since the solution such as the HMDS was supplied into the chemical solution vaporizing tank, a degree of freshness of the solution decreases, and the concentration lowers due to decomposition so that the effect thereof on the wafer deteriorates. Therefore, when a difference occurs in condition of use of the HMDS between the tanks due to operating conditions of the respective processing modules, a difference occurs in freshness of the HMDS between the tanks, and thus occur in state of the hydrophobic processing between the wafers so that yield may lower. In the foregoing structure having the coating and developing device that includes the plurality of hydrophobic processing systems, the structure may employ the HMDS solution vaporizing tanks equal in number of the hydrophobic processing modules. This increases a space required for installing these hydrophobic processing systems, and thus disadvantageously increases the installation space of the developing device.

Japanese Utility Model Publication No. 7-34936 has disclosed a structure in which a chemical solution vaporizing tank is shared among a plurality of processing modules, and is partitioned into chambers between which a solution can flow, and vaporizing processing is performed by bubbling in each of the separated chambers. However, the respective chambers of the tank are connected to the processing modules by pipes, and difference in pressure loss in the pipe usually occur between the pipes due to differences in diameter and/or length between the pipes. Due to an influence of the pressure losses in the pipes as well as the foregoing differences in operation condition between the processing modules, differences in pressure between the separated chambers increase as the processing gas is supplied into the respective processing modules, and differences gradually occurs in chemical solution level between the chambers. Thereby, a ratio between the chemical solution and the gas varies in each chamber, and consequently the vaporization efficiency varies in each chamber independently of the other chambers so that differences occur between the concentrations of the HMDS gas supplied to the respective modules, resulting in a problem that the control becomes impossible.

SUMMARY OF THE INVENTION

The invention has been made in view of the above circumstances, and an object of the invention is to provide a chemical solution vaporizing tank and a chemical solution processing system in which a processing gas is produced by supplying a vaporization gas (i.e., a gas for vaporization) to a chemical solution stored in the chemical solution vaporizing tank, and is supplied to a work (i.e., an object to be processed), and particularly is to suppress a difference in concentration of the processing gases to be supplied to the plurality of works, respectively.

A chemical solution vaporizing tank of the invention for producing a processing gas by supplying a vaporization gas to a chemical solution stored in the chemical solution vaporizing tank, and supplying the processing gas to a work for performing processing, includes a tank body having an internal space laterally and airtightly partitioned by a partition member into a plurality of vaporizing chamber; a chemical solution passage located under a liquid level in each of the vaporizing chambers and formed at each partition member for passing the chemical solution between the vaporizing chambers; a gas passage located above the liquid level in each of the vaporizing chambers and formed at the partition member to communicate the vaporizing chambers with each other for uniformizing pressures in the respective vaporizing chambers; a vaporization gas supply unit arranged for each of the vaporizing chambers for supplying the vaporization gas to the chemical solution in the vaporizing chamber and producing the processing gas in a space above the liquid level of the chemical solution; a processing gas takeout passage arranged at each of the vaporizing chambers for externally taking out the processing gas produced in the vaporizing chamber; a chemical solution supply passage for supplying the chemical solution to the vaporizing chamber; and an atmospheric opening for supplying the chemical solution from the chemical solution supply passage to the vaporizing chamber.

The chemical solution supply passage may be shared among the vaporizing chambers. The partition member forms, e.g., a liquid level monitoring chamber provided with a liquid level sensor for sensing a liquid level in the vaporizing chamber in addition to the plurality of vaporizing chambers. The liquid level monitoring chamber includes a chemical solution passage opened under the liquid level in the vaporizing chamber for passing the chemical solution between the vaporizing chamber and the liquid level monitoring chamber, and a gas passage opened above the liquid level in the vaporizing chamber for uniformizing the pressures in the vaporizing chambers and the liquid level monitoring chamber. The chemical solution is supplied to the vaporizing chambers based on the liquid level sensed by the liquid level sensor. The chemical solution supply passage may be arranged in the liquid level monitoring chamber, and the vaporizing chambers may surround an outer periphery of the liquid level monitoring chamber.

A chemical solution processing system of the invention includes a plurality of processing modules each having a processing space for processing a work with a processing gas; the foregoing chemical solution vaporizing tank; and a gas supply unit supplying a processing gas to each of the processing spaces via the processing gas takeout passage.

According to the chemical solution vaporizing tank of the invention, the partition member that laterally partitions the inside of the tank body into the plurality of vaporizing chambers is provided with the chemical solution passage opened under the liquid level for passing the chemical solution between the vaporizing chambers, and the gas passage opened above the liquid level for uniformizing the pressures in the respective vaporizing chambers. Therefore, the chemical solution can flow between the vaporizing chambers so that the quantity ratios of the chemical solutions in the vaporizing chambers can be uniform, and the variations in concentration of the chemical solutions can be suppressed. Therefore, even when the vaporization processing is individually performed in each vaporizing chamber, the variations in concentration of the processing gas prepared by vaporizing the chemical solution can be suppressed, and it is possible to suppress the variations in processing state of each work to which the processing gas is supplied. Since the vaporization processing is individually performed in each vaporizing chamber, it is not necessary to employ the chemical solution vaporizing tanks corresponding in number to the works so that the space for installing the chemical solution vaporizing tank can be small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
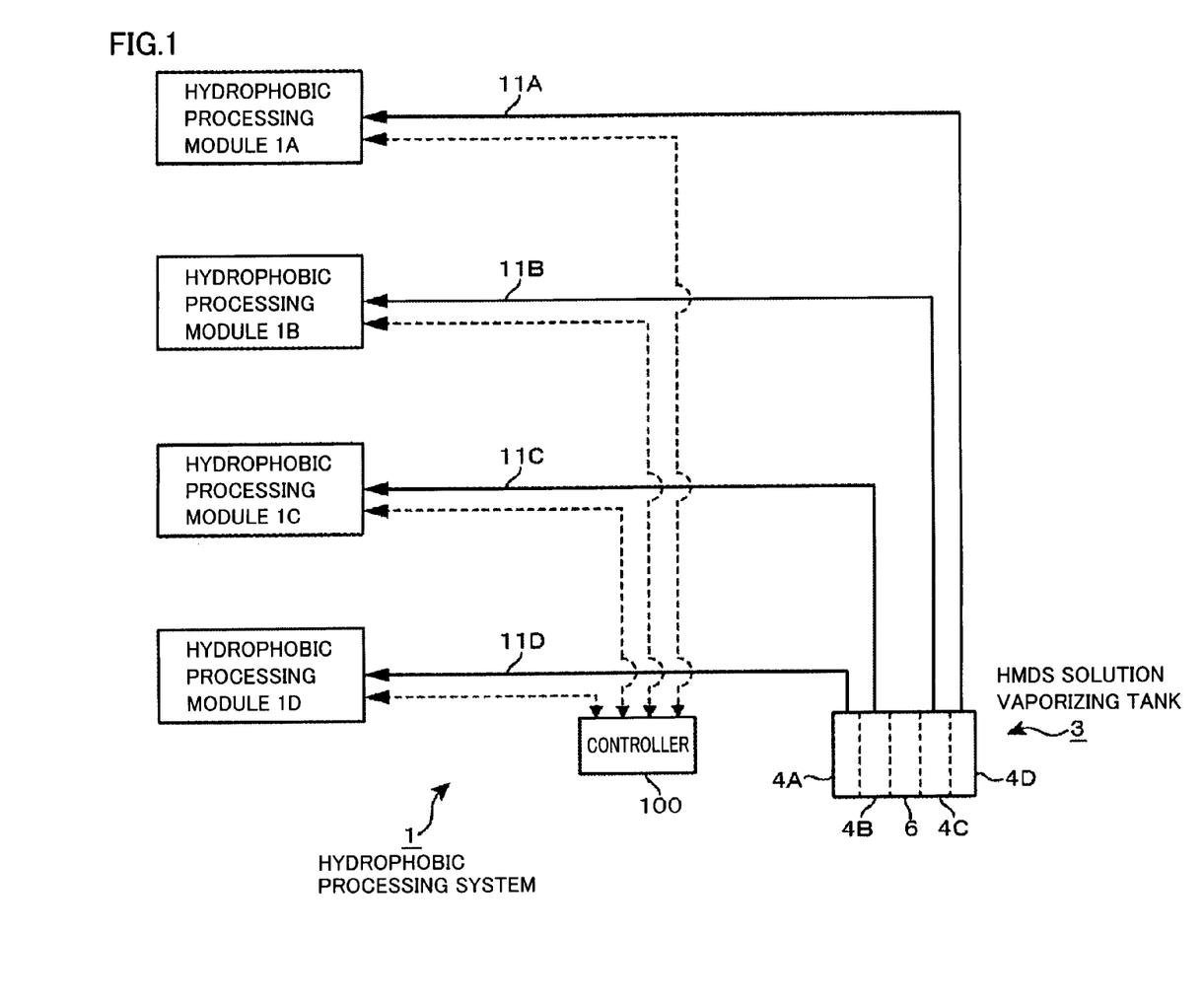
FIG. 1 is a block diagram of a hydrophobic processing system with an HMDS solution vaporizing tank according to an embodiment of the invention.

A hydrophobic processing system 1 that is a chemical solution processing system including an HMDS solution vaporizing tank 3 for vaporizing a HMDS solution (i.e., a chemical solution) will be described below as an example of an embodiment of a chemical solution vaporizing tank of the invention. FIG. 1 is a schematic view of hydrophobic processing system 1. Hydrophobic processing system 1 includes hydrophobic processing modules 1A, 1B, 1C and 1D, which are connected via gas supply pipes 11A, 11B, 11C and 11D to vaporizing chambers 4A, 4B, 4C and 4D arranged in chemical solution vaporizing tank 3, respectively.

Figure 2:
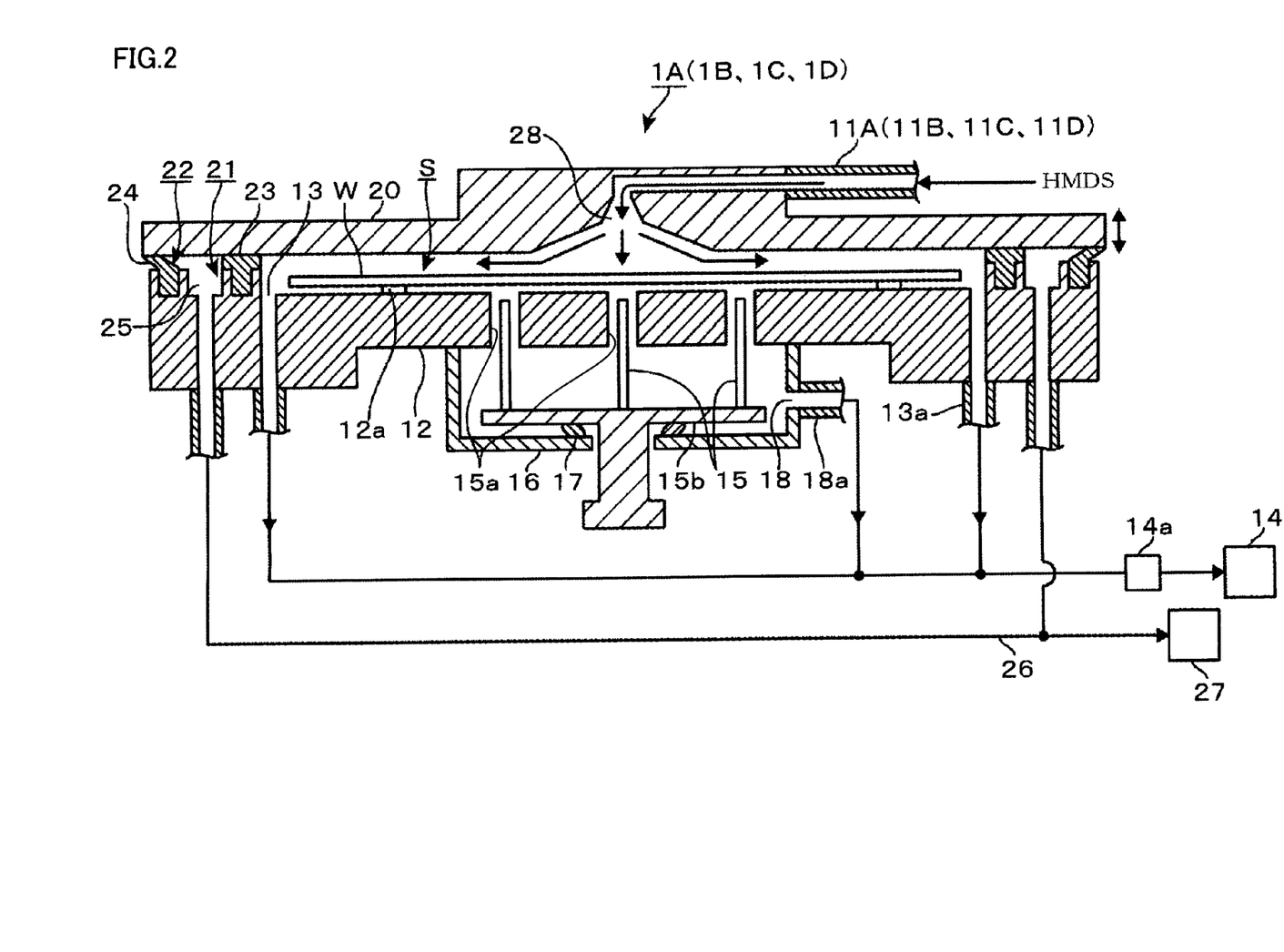
FIG. 2 is a longitudinal section of a hydrophobic processing module included in the hydrophobic processing system.

Hydrophobic processing modules 1A-1D will be described below. Hydrophobic processing modules 1A-1D and hydrophobic processing module 1A will now be described by way of example with reference to FIG. 2. Hydrophobic processing module 1A includes a table 12, and four (only two is shown in FIG. 2) projections 12a that are spaced from each other, e.g., in a circumferential direction of wafer W are arranged on table 12 for supporting a rear surface of wafer W. Table 12 is provided with exhaust ports 13 surrounding an outer periphery of wafer W. Exhaust port 13 is connected to an end of an exhaust pipe 13a, of which other end is connected to exhaust portion 14 made of a vacuum pump or the like via pressure control portion 14a controlling, e.g., an exhaust rate.

Table 12 is provided with three vertical holes 15a aligned to each other in the circumferential direction of wafer W. A vertically movable pin 15 is inserted into each hole 15a. A drive mechanism (not shown) can vertically move a base 15b carrying vertically movable pins 15 so that each vertically movable pin 15 can move above and below the surface of table 12 for transferring wafer W between table 12 and a transporting mechanism (not shown) that transports wafer W to hydrophobic processing module 1A. A cover 16 and an O-ring 17 are arranged. An end of an exhaust pipe 18a is connected to cover 16 via an exhaust port 18. The other end of exhaust pipe 18a is joined to exhaust pipe 13a so that the HMDS gas that flows into holes 15a from a processing space S surrounded by a lid 20 to be described later and table 12 is prevented from leaking externally from hydrophobic processing module 1A during processing of wafer W.

Annular protrusions 21 and 22 that protrude upward and have different diameters, respectively, are arranged around exhaust ports 13. Annular protrusions 21 and 22 are provided at upper portions with seal members 23 and 24, respectively, that can come into contact with a rear surface of lid 20 (to be described later) when lid 20 lowers. A groove 25 formed between protrusions 21 and 22 is connected to an end of an exhaust pipe 26 of which other end is connected to a suction mechanism 27. When lid 20 is in contact with seal members 23 and 24, a gas is exhausted from groove 25, and the rear surface of lid 20 is in close contact with seal members 23 and 24 so that processing space S is airtightly closed to prevent external leakage of the HMDS gas from hydrophobic processing module 1A. When the processing is not being performed on wafer W, processing space S is in communication with, e.g., an atmosphere, and serves as an atmospheric opening when the HMDS solution is to be supplied into HMDS solution vaporizing tank 3 as well be described later.

A vertically moving mechanism (not shown) can move lid 20 vertically with respect to table 12 for transporting wafer W into processing space S. Lid 20 is provided at a center of its rear surface with a supply port 28, and is connected to gas supply pipe 11A already described.

In hydrophobic processing module 1A, when lid 20 is a raised position with respect to table 12, wafer W is placed on table 12, and then lid 20 lowers to close airtightly processing space S. Then, the HMDS gas is supplied from supply port 28 to push away a gas from processing space S into exhaust pipes 13a and 18a, and is supplied over the whole surface of wafer W as represented by arrows in FIG. 2 to perform the hydrophobic processing on wafer W. After the hydrophobic processing, the gas is exhausted through exhaust pipes 13a and 18a, and an N2 gas supply mechanism (not shown) supplies an N2 gas into processing space S so that the HMDS gas in processing space S is removed. For example, a controller 100 to be described later controls the vertical movement of lid 20 and the exhausting from processing space S.

Figure 3:
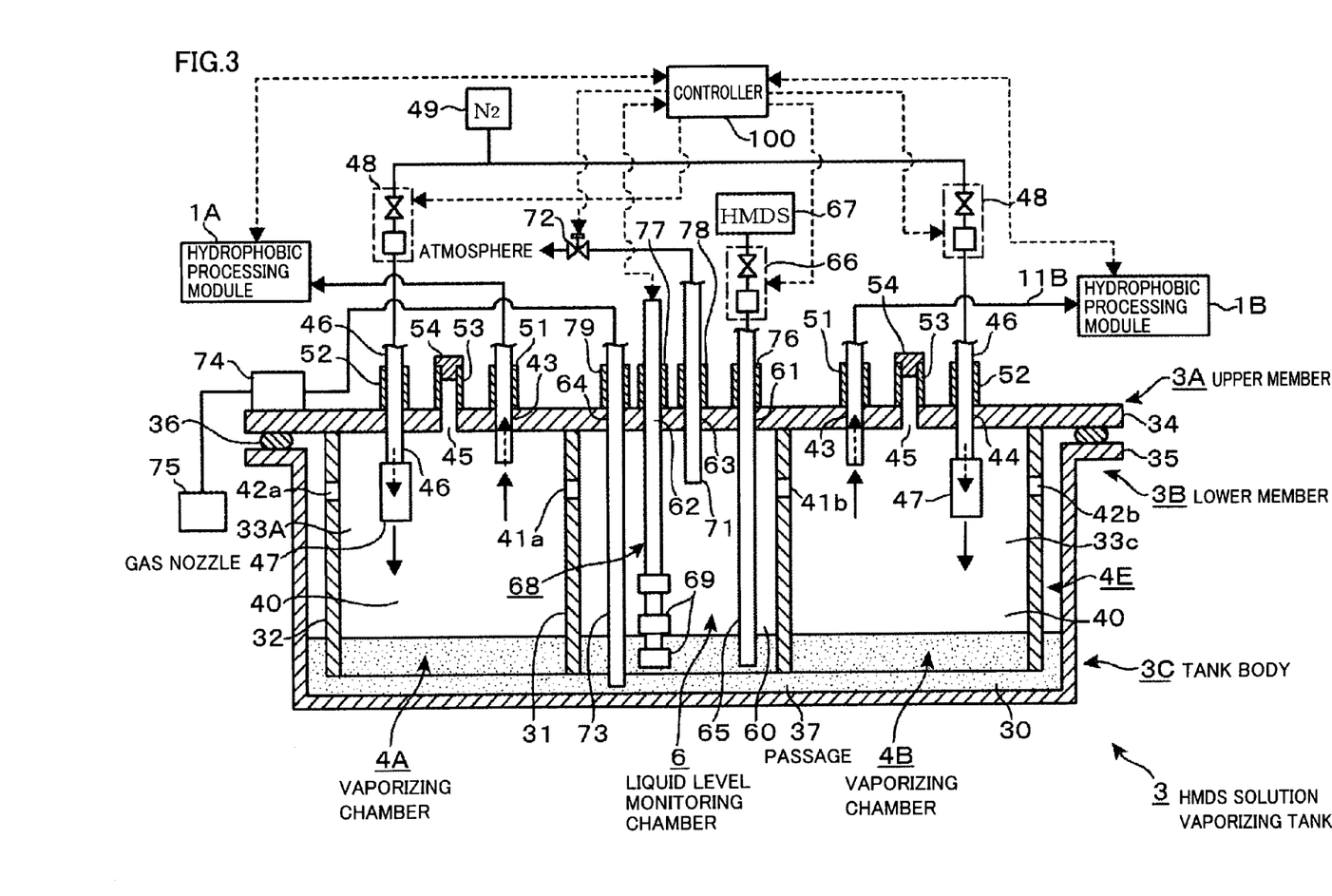
FIG. 3 is a longitudinal section of the HMDS solution vaporizing tank.
Figure 4:
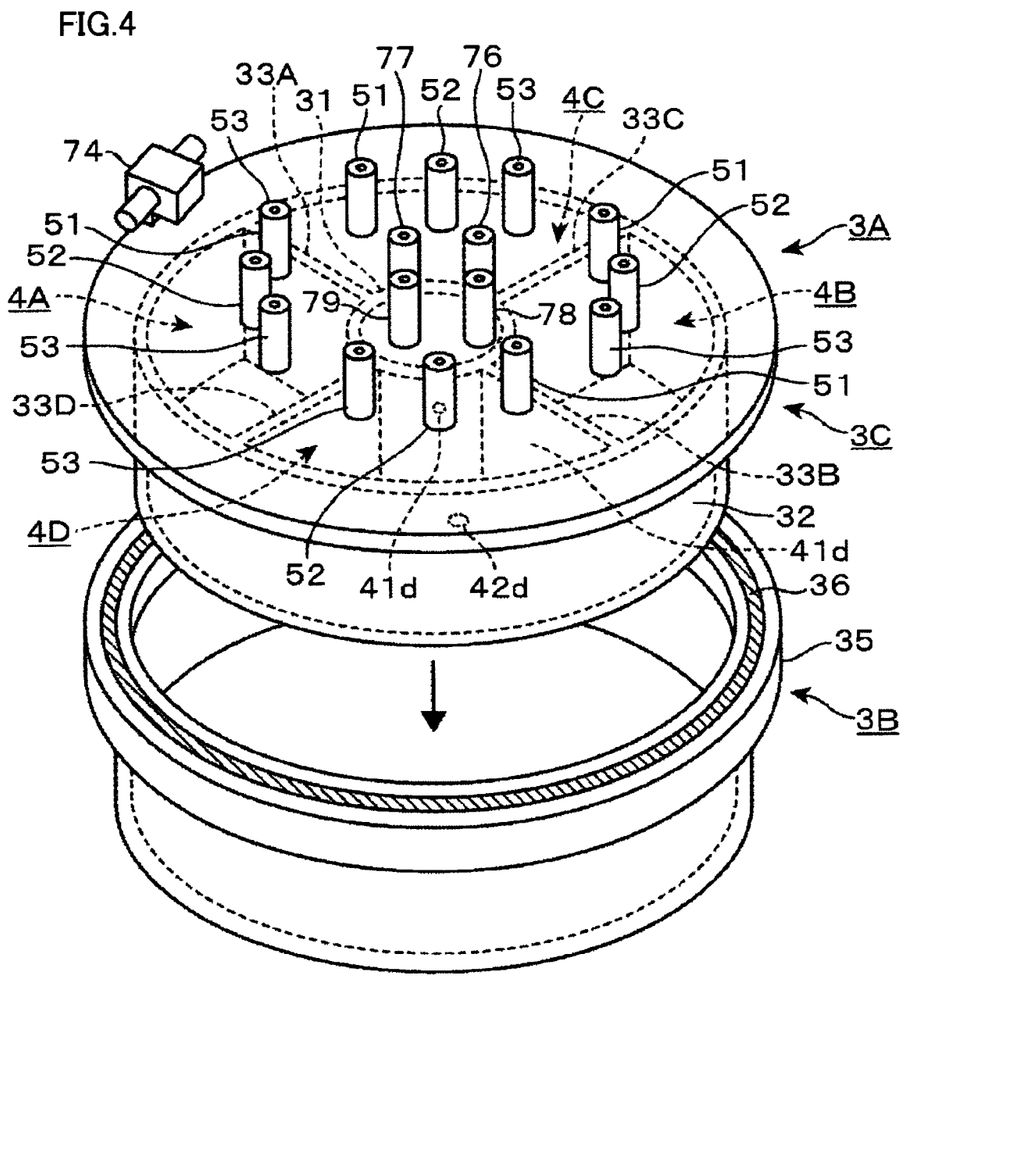
FIG. 4 is an exploded perspective view of the HMDS solution vaporizing tank.
Figure 5:
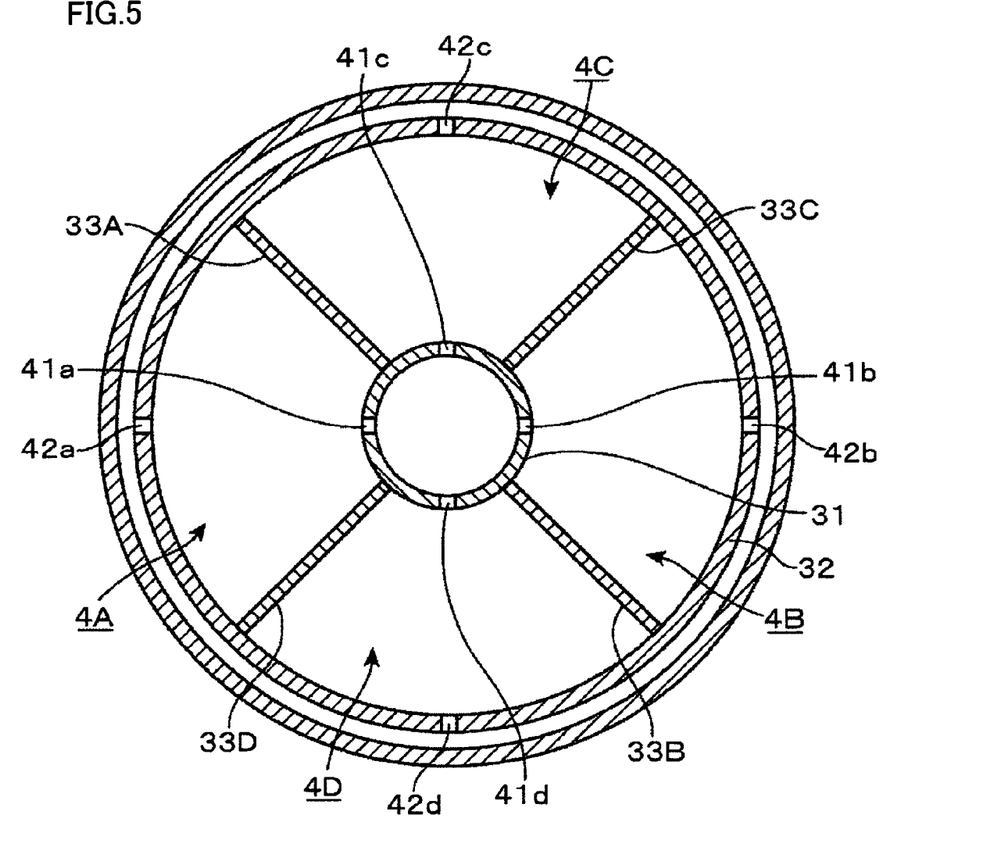
FIG. 5 is a horizontal section of the HMDS solution vaporizing tank.

Then, HMDS solution vaporizing tank 3 forming a major part of the invention will be described with reference to FIGS. 3 to 5. FIGS. 3, 4 and 5 are a longitudinal section, an exploded perspective view and a horizontal section of the HMDS solution vaporizing tank, respectively. HMDS solution vaporizing tank 3 is formed of, e.g., a flat circular container, and includes an upper member 3A forming a top wall of HMDS solution vaporizing tank 3 as well as partitions of the chambers formed in HMDS solution vaporizing tank 3, and a lower member 3B forming a bottom wall and a side wall of HMDS solution vaporizing tank 3. Upper and lower members 3A and 3B form a tank body 3C.

Upper member 3A includes cylindrical partitions 31 and 32 having different diameters, respectively, as shown in FIGS. 4 and 5. Partition 32 surrounds partition 31, and these partitions 31 and 32 are concentric with each other in a plan view. Four partitions 33 (33A, 33B, 33C and 33D) that are in a cross arrangement in a plan view extend from partition 31 to partition 32. These partitions 31-33 form four chambers forming vaporizing chambers 4A, 4B, 4C and 4D, respectively, that are circumferentially arranged in a plan view as well as a chamber that forms a liquid level monitoring chamber 6 surrounded by these vaporizing chambers 4A-4D. A circular plate 34 forming the top wall of tank 3 is arranged above partitions 31-33. A peripheral portion of circular plate 34 protrudes radially outward from partition 32.

Lower member 3B has a cylindrical form closed at its bottom, and partition 32 of upper member 3A can be located inside its opening. An upper portion of the side wall of lower member 3B protrudes radially outward to form a flange 35, which is in close contact with the peripheral portion of circular plate 34 of upper member 3A through an O-ring 36 so that the inner space of chemical solution vaporizing tank 3 is airtightly closed.

As shown in FIG. 3, the lower end of each of partitions 31-33 is spaced from a bottom surface of chemical solution vaporizing tank 3 to form a passage 37 of an HMDS solution 30. Owing to this passage 37, HMDS solution 30 supplied into HMDS solution vaporizing tank 3 can flow between vaporizing chambers 4A-4D, liquid level monitoring chamber 6 and an outer peripheral chamber 4E that is defined between partition 32 arranged outside vaporizing chambers 4A-4D and the side wall of chemical solution vaporizing tank 3.

Partition 31 is provided with vents 41a, 41b, 41c and 41d for communication between liquid level monitoring chamber 6 and respective vaporizing chambers 4A, 4B, 4C and 4D. Also, partition 32 is provided with vents 42a, 42b, 42c and 42d for communication between outer peripheral chamber 4E and respective vaporizing chambers 4A, 4B, 4C and 4D. These vents 41a-41d and 42a-42d are located at positions higher than an upper limit level HL of the liquid level of HMDS solution 30 that is supplied into chemical solution vaporizing tank 3 as described later, and pass a gas between the chambers 4A-4E with each other to keep a uniform pressure in chambers 4A-4E. Thereby, vents 41a-41d and 42a-42d serve to allow flowing of HMDS solution 30 between these chambers 4A-4E and thereby to keep a uniform liquid level in chambers 4A-4E. If each of vents 41a-41d and 42a-42d had an excessively large diameter, vaporizing processing performed in one of the vaporizing chambers would affect the vaporizing processing performed in the other chambers to cause, e.g., variations in concentration of the processing gas. Therefore, the diameter is preferably 5 mm or less, and is more preferably 2 mm or less. Although each kind of vents 41a-41d and 42a-42d shown in FIG. 3 is one in number, a plurality of vents may be employed for each kind because it is merely required to keep the uniform liquid level without affecting the vaporizing processing in the respective chambers as already described.

Vaporizing chambers 4A-4D will now be described. Vaporizing chambers 4A-4D have substantially the same structure, and the following description will be given by way of example on vaporizing chamber 4A. Circular plate 34 has three holes 43, 44 and 45 in communication with vaporizing chamber 4A. Although, holes 43, 44 and 45 in HMDS solution vaporizing tank 3 that is practically manufactured are aligned in the circumferential direction as shown in FIG. 4, FIG. 3 shows them in laterally aligned positions for the sake of illustration. As described above, gas supply pipe 11A having one end connected to processing module 1A has the other end that protrudes into vaporizing chamber 4A through hole 43 and is open to a space 40 above the liquid surface in vaporizing chamber 4A.

A gas supply pipe 46 has an end extending into vaporizing chamber 4A through hole 44. A gas nozzle 47 is arranged at this end of gas supply pipe 46 so that the N2 gas supplied from gas supply pipe 46 to gas nozzle 47 is discharged onto the liquid level of HMDS solution 30. Gas nozzle 47 corresponds to a gas supply unit producing the processing gas. The other end of gas supply pipe 46 is connected to an N2 gas source 49 storing the N2 gas via a flow rate controller 48 including a valve, a massflow controller and the like. Flow rate controller 48 receives a control signal from controller 100 to be described later, and controls supply and cutoff of the N2 gas onto the liquid surface of HMDS solution 30. Flow rate controller 48 corresponds to gas supply portion for supplying the HMDS gas to hydrophobic processing module 1A. Joints 51, 52 and 53 each having a cylindrical form are arranged on circular plate 34. Joints 51 and 52 support gas supply pipes 11A and 46, respectively. In this embodiment, a seal member 54 closes hole 45 with joint 53 interposed therebetween.

Other vaporizing chambers 4B-4D will be briefly described below. Similarly to the other end of gas supply pipe 11A, the other ends of gas supply pipes 11B, 11C and 11D protrude into vaporizing chambers 4B, 4C and 4D, and are open to spaces 40 of vaporizing chambers 4B, 4C and 4D, respectively.

Then, liquid level monitoring chamber 6 will be described. Circular plate 34 is provided with four holes 61, 62, 63 and 64 in communication with liquid level monitoring chamber 6. Although holes 61-64 in the tank that is actually manufactured are aligned in the circumferential direction, FIG. 3 shows these holes aliened laterally in one row for the sake of illustration. Through hole 61, an end of an HMDS solution supply pipe 65 protrudes into liquid level monitoring chamber 6, and is open to it. The other end of HMDS solution supply pipe 65 is connected to an HMDS solution source 67 storing fresh HMDS solution 30 via a flow rate controller 66 including a valve and a massflow controller. In accordance with the control signal from controller 100, flow rate controller 66 controls the supply and cutoff of HMDS solution 30 from HMDS solution source 67 to vaporizing tank 3, and each of chambers 4A-4E of vaporizing tank 3 stores HMDS solution 30 thus supplied.

Liquid level monitoring chamber 6 is provided with a liquid level sensor 68, which extends through hole 62 and has a lower portion located under the liquid surface of HMDS solution 30. A plurality of sensing units 69 are arranged at and between the lower and upper portions of liquid level sensor 68 for sensing the vertical position of the liquid level, i.e., the liquid level. Liquid level sensor 68 provides a signal corresponding to the liquid level sensed by sensing unit 69 to controller 100.

An end of an exhaust pipe 71 extends through hole 63 into liquid level monitoring chamber 6, and is open to a space 60 above the liquid surface in liquid level monitoring chamber 6. The other end of exhaust pipe 71 is open to an atmosphere outside HMDS solution vaporizing tank 3. Exhaust pipe 71 is provided with a valve 72 that opens and closes according to the control signal from controller 100, and space 60 is open to the atmosphere when valve 72 is open.

In a certain state, the processing of wafer W is not performed in one of hydrophobic processing modules 1A-1D, and processing space S that is not airtightly closed is present. In this state, when the HMDS solution is supplied into HMDS solution vaporizing tank 3, the gas in tank 3 can flow externally from the hydrophobic processing module through processing space S so that HMDS solution 30 can be supplied into HMDS solution tank 3. However, when the hydrophobic processing is being performed on wafers W in all processing modules 1A-1D, all the processing spaces S are airtightly closed so that the gas in HMDS solution vaporizing tank 3 cannot flow externally from the hydrophobic processing module via processing space S. In this state, the HMDS solution cannot be supplied due to the inner pressure of HMDS solution vaporizing tank 3. Therefore, valve 72 is opened to allow the flowing of the gas from HMDS solution vaporizing tank 3 to the atmosphere, and thereafter HMDS solution 30 is supplied into HMDS solution vaporizing tank 3.

An end of a drain pipe 73 extends through hole 64 into liquid level monitoring chamber 6, and is open under the liquid surface of HMDS solution 30. The other end of drain pipe 73 is connected to a drain mechanism 75 via a valve 74 arranged on circular plate 34. When valve 74 is opened, e.g., manually, the HMDS solution is drained from tank 3. Joints 76, 77, 78 and 79 have cylindrical forms, and support HMDS solution supply pipe 65, liquid level sensor 68, exhaust pipe 71 and drain pipe 73, respectively.

Controller 100 will now be described. Controller 100 is formed of, e.g., a computer and has a program storage (not shown in the figure). The program storage stores programs formed of, e.g., software including sets of commands to perform developing processing to be described later in connection with operations. Controller 100 reads the programs and controls the supply of the gas from N2 gas nozzle 47 as well as the supply of HMDS solution 30 into HMDS solution vaporizing tank 3. These programs are stored in the program storage by recording or storing them, e.g., on a hard disk, a compact disk, a magneto-optical disk or a memory card.

Figure 6:
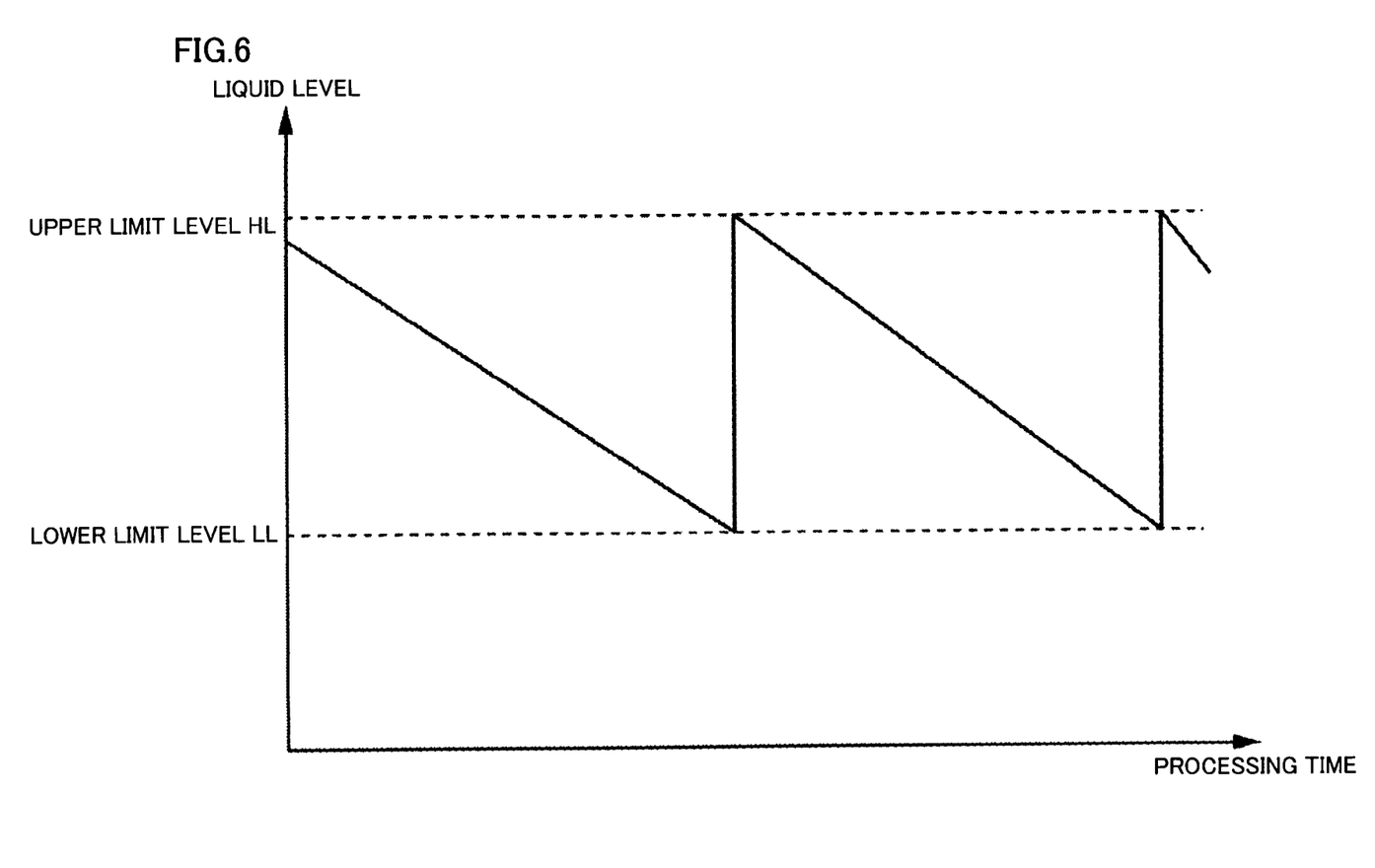
FIG. 6 is a graph representing variations in liquid level.

Controller 100 further includes an input screen (not shown). On this input screen, the user of hydrophobic processing system 1 can set the upper and lower limit levels HL and LL of the liquid level of HMDS solution 30 in HMDS solution vaporizing tank 3. As will be described later in connection with the operation, when the HMDS gas is supplied to each of hydrophobic processing modules 1A-1D to change the liquid level of HMDS solution 30 to lower limit level LL, controller 100 supplies HMDS solution 30 from HMDS solution source 67 into HMDS solution vaporizing tank 3. Thereby, the liquid level attains upper limit level HL as shown in FIG. 6, and the liquid level in each of processing modules 1A-1D is kept between levels HL and LL during the processing. Upper limit level HL is lower than the positions of vents 41a-41d and 42a-42d, and lower limit level LL is higher than the upper end of passage 37. The values of upper and lower limit levels HL and LL are set to prevent variations in hydrophobic processing due to differences in HMDS gas concentration produced at the liquid level between them.

For example, when a predetermined time elapses since HMDS solution 30 is supplied from HMDS solution source 67, an alarm is, e.g., displayed on the input screen. Based on this alarm, the user opens valve 74 to drain entire HMDS solution 30 from HMDS solution vaporizing tank 3. Thereafter, the user closes valve 74, and then touches a switch displayed on the input screen so that HMDS solution 30 is supplied into HMDS solution vaporizing tank 3 until the liquid level attains upper limit level HL. Thereby, HMDS solution 30 can be kept fresh in vaporizing tank 30.

The operation of hydrophobic processing system 1 will now be described with reference to FIGS. 7A-7D in connection with an example in which hydrophobic processing modules 1A and 1B perform the processing on wafers W. For example, when wafer W is placed on table 12 of hydrophobic processing module 1A and its processing space S is airtightly closed, hydrophobic processing module 1A provides a signal to controller 100. Controller 100 receiving this signal provides a control signal to flow rate controller 48 so that gas nozzle 47 of vaporizing chamber 4A supplies the N2 gas at a predetermined flow rate onto the liquid surface of HMDS solution 30 in vaporizing chamber 4A. The supplied H2 gas promotes the vaporization of the HMDS solution and HMDS solution 30 in tank 3 raises the internal pressure of vaporizing chamber 4A so that the HMDS gas is supplied to hydrophobic processing module 1A through gas supply pipe 11A, and the hydrophobic processing is performed on wafer W.

Figure 7A:
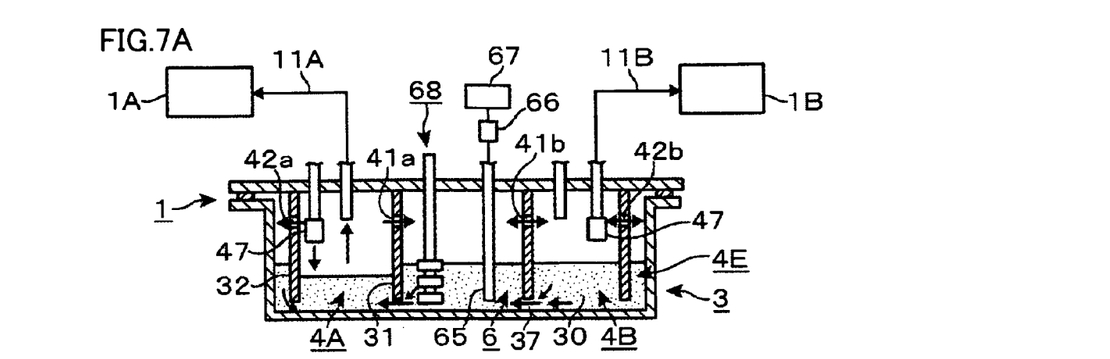
FIGS. 7A-7D illustrate variations in liquid level in the HMDS solution vaporizing tank.
Figure 7B:
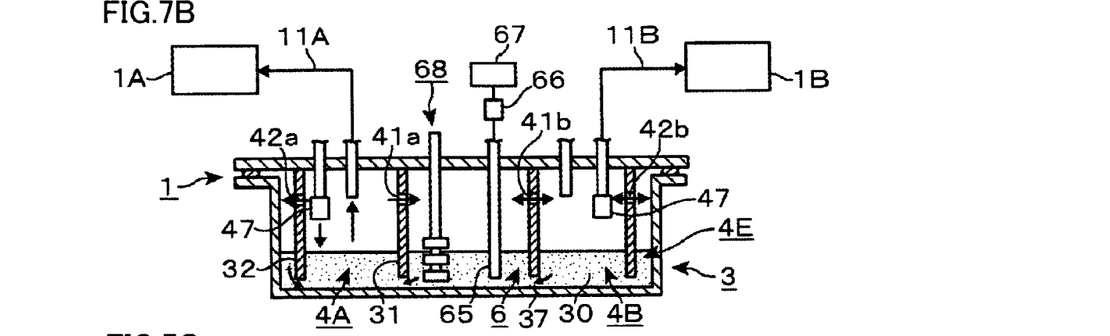

The N2 gas supplied into vaporizing chamber 4A flows through vents 41a-41d and 42a-42d into other vaporizing chambers 4B-4D, outer peripheral chamber 4E and liquid level monitoring chamber 6, and HMDS solution 30 in these vaporizing chambers 4B-4D, outer peripheral chamber 4E and liquid level monitoring chamber 6 flow through passage 37 into vaporizing chamber 4A so that HMDS solution 30 in vaporizing tank 3 decreases while keeping the uniform liquid level in vaporizing chambers 4B-4D, outer peripheral chamber 4E and liquid level monitoring chamber 6 (FIGS. 7A and 7B).

Then, wafer W is transported onto table 12 of hydrophobic processing module 1B. When its processing space S is airtightly closed, hydrophobic processing module 1B provides a signal to controller 100. Controller 100 receiving the signal provides a control signal to flow rate controller 48 corresponding to vaporizing chamber 4B, and gas nozzle 47 supplies the N2 gas onto the liquid surface of vaporizing chamber 4B at the same flow rate as the gas supplied into vaporizing chamber 4A so that the HMDS gas is supplied to hydrophobic processing module 1B through gas supply pipe 11B, and the hydrophobic processing is performed on wafer W in hydrophobic processing module 11B.

Figure 7C:
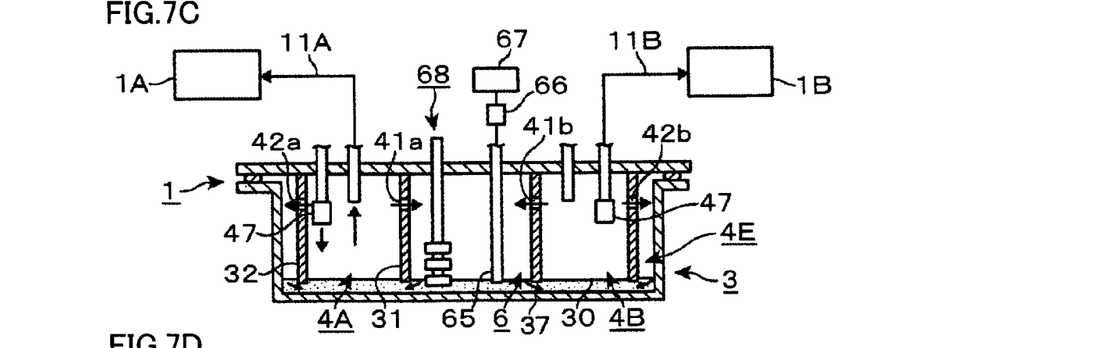
Figure 7D:
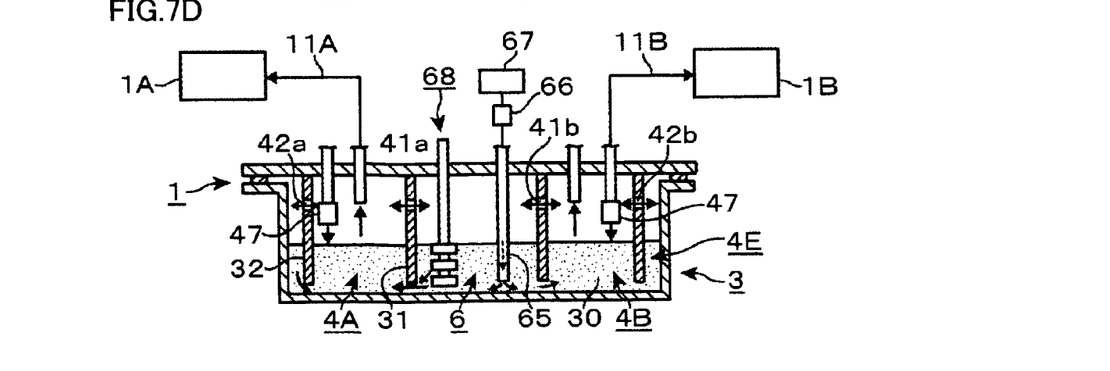

The N2 gas supplied to vaporizing chamber 4B flows into vaporizing chambers 4C, 4D, outer peripheral chamber 4E and liquid level monitoring chamber 6 through vents 41b-41d and vents 42b-42d, and HMDS solution 30 in these vaporizing chambers 4C and 4D as well as liquid level monitoring chamber 6 flows into vaporizing chamber 4A as well as vaporizing chamber 4B so that HMDS solution 30 in vaporizing tank 3 continuously decreases while the liquid level is uniformly kept in vaporizing chambers 4A-4D, outer peripheral chamber 4E and liquid level monitoring chamber 6 (FIG. 7C).

When HMDS solution 30 vapors to a large extent to lower its liquid level to preset lower limit level LL, liquid level sensor 68 provides a signal to controller 100, and controller 100 provides a control signal to flow rate controller 66 so that HMDS solution source 67 supplies HMDS solution 30 through HMDS solution supply pipe 65 to vaporizing tank 3, and the liquid level thereof rises. When the liquid level attains preset upper level HL, liquid level sensor 68 provides a signal to controller 100 to stop the supply of HMDS solution 30.

When a predetermined time elapses since the supply of the N2 gas into vaporizing chamber 4A started, the supply of the N2 gas into vaporizing chamber 4A stops, and the hydrophobic processing in processing module 1A ends. When a predetermined time elapses after the supply of the N2 gas into vaporizing chamber 4B started, the supply of the N2 gas into vaporizing chamber 4B stops, and the hydrophobic processing in processing module 1B ends.

HMDS solution vaporizing tank 3 described above includes partitions 31, 32 and 33A-33D laterally partitioning the space in tank 3 into vaporizing chambers 4A-4D, passage 37 opened under the liquid level of HMDS solution 30 and passing HMDS solution 30 between vaporizing chambers 4A-4D, and vents 41a-41d opened above the liquid level of HMDS solution 30 for keeping a uniform pressure in vaporizing chambers 4A-4D. Thereby, HMDS solution vaporizing tank 3 can keep the uniform pressure in vaporizing chambers 4A-4D, and can pass HMDS solution 30 between vaporizing chambers 4A-4D so that it is possible to suppress differences in liquid level between vaporizing chambers 4A-4D, and to suppress differences in concentration of HMDS solution 30 between vaporizing chambers 4A-4D. Accordingly, even when vaporizing chambers 4A-4D individually perform the vaporizing procession of the HMDS solution, the differences in concentration of the HMDS gas can be suppressed. Consequently, it is possible to suppress differences in state of the hydrophobic processing on wafer W between hydrophobic processing modules 1A-1D.

Since HMDS solution vaporizing tank 3 includes independent vaporizing chambers 4A-4D, the space required for installing the chemical solution vaporizing tank can be reduced, as compared with the structure employing chemical solution vaporizing tanks equal in number to the hydrophobic processing modules. Since HMDS solution 30 can flow between vaporizing chambers 4A-4D and liquid level monitoring chamber 6, vaporizing chambers 4A-4D share liquid level sensor 68, HMDS solution supply pipe 65, drain pipe 73 and others, and it is not necessary to arrange these member and parts dedicated to each of vaporizing chambers 4A-4D. Therefore, the manufacturing cost can be reduced, as compared with the case where the HMDS solution vaporizing tanks equal in number to hydrophobic processing modules are employed.

When there is a difference in operation condition between hydrophobic processing modules 1A-1D, the HMDS solution can be efficiently consumed, as compared with the case where the vaporizing tanks corresponding in number to the hydrophobic processing modules are employed, because the HMDS solution tank is shared. Therefore, when the solution is drained due to lowering of the degree of freshness of the HMDS solution, the quantity of the drained solution can be reduced so that the cost can be low.

HMDS solution vaporizing tank 3 includes liquid level monitoring chamber 6 separated from vaporizing chambers 4A-4D, and the liquid level of liquid level monitoring chamber 6 is detected to manage the liquid level in each of vaporizing chambers 4A-4D. Therefore, even when the liquid surface waves in vaporizing chambers 4A-4D due to the vaporizing processing executed in vaporizing chambers 4A-4D, such a situation can be prevented that the waving of these liquid surfaces propagates to the liquid surface in liquid level monitoring chamber 6 and thereby causes waving of the liquid surface in liquid level monitoring chamber 6. Accordingly, the liquid level can be precisely managed to suppress the variations in concentration of the HMDS gas so that the variations in hydrophobic processing on wafer W can be reliably suppressed. Since liquid level monitoring chamber 6 is arranged in a central position of vaporizing tank 3 and is surrounded by vaporizing chambers 4A-4D, inclination of the liquid surface in liquid level monitoring chamber 6 can be suppressed even when a floor bearing HMDS solution vaporizing tank 3 inclines, as compared with the case where liquid level monitoring chamber 6 is arranged in an outer peripheral portion. This is preferable because the lowering of the sensing precision of the liquid level can be suppressed.

As described above, HMDS solution 30 can be supplied into HMDS solution vaporizing tank 3 by opening valve 72 of liquid level monitoring chamber 6 even when the processing is being performed in each of hydrophobic processing modules 1A-1D, and it is not necessary to stop the processing of each of hydrophobic processing modules 1A-1D. Therefore, the operation of processing modules 1A-1D is not affected so that lowering of the throughput of these modules can be suppressed.

For example, in the above embodiment, valve 74 may be configured to open and close at predetermined intervals for automatically draining the solution. The chemical solution to be used is not restricted to the HMDS solution, and the layouts of the vaporizing chambers and the liquid level monitoring chamber are not restricted to those in the foregoing embodiment. For supplying the HMDS gas at different concentrations to the respective hydrophobic processing modules, such configurations may be employed that the N2 gas is supplied at different flow rates to the liquid surfaces of respective vaporizing chambers 4A-4D and/or that vaporizing chambers 4A-4D have different sizes, respectively.

Figure 8:
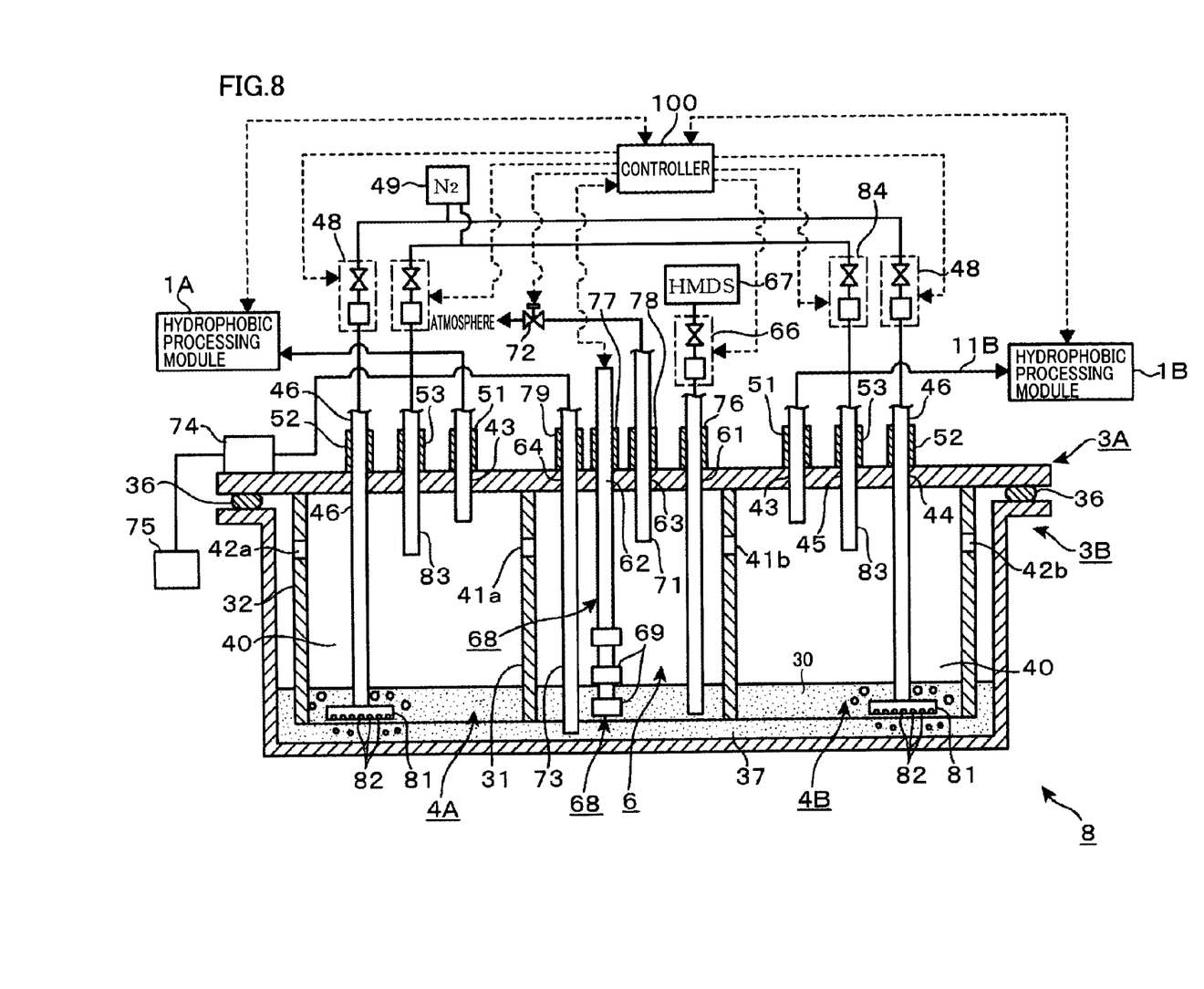
FIG. 8 is a longitudinal section showing another example of a structure of the HMDS solution vaporizing tank.

Then, an HMDS solution vaporizing tank 8 that is a modification of HMDS solution vaporizing tank 3 will be described with reference to FIG. 8. HMDS solution vaporizing tank 8 has substantially the same structure as HMDS solution vaporizing tank 3, and the same components bear the same reference numbers. In this embodiment, vaporizing chambers 4A-4D have the same structures, and therefore vaporizing chamber 4A will be representatively described below. N2 gas supply pipe 46 is provided at its end with a flat plate-like bubbling nozzle 81 (i.e., a nozzle for bubbling) having many jets 82. Nozzle 81 is located under the liquid level so that HMDS solution 30 is vaporized by bubbling. An end of a dilution gas supply pipe 83 extends into vaporizing chamber 4A through joint 53, and is open to space 40 above the liquid level. The other end of dilution gas supply pipe 83 is connected to N2 gas source 49 via a flow rate controller 84 formed of a valve and a massflow controller. Flow rate controller 84 controls the supply and cutoff of the N2 gas from N2 gas source 49 to space 40 based on a control signal provided from controller 100, and serves to dilute the HMDS gas produced in space 40 by the bubbling for lowering its concentration. Thereby, the HMDS gas at an appropriate concentration is supplied to hydrophobic processing module 1A.

HMDS solution vaporizing tank 8 described above has substantially the same effect as HMDS solution vaporizing tank 3. In HMDS solution vaporizing tank 8, the bubbling tends to wave the liquid surfaces in vaporizing chambers 4A-4D. Therefore, the configuration that the liquid level is monitored in liquid level monitoring chamber 6 separated from vaporizing chambers 4A-4D is effective particularly at precisely managing the liquid level.

Figure 9:
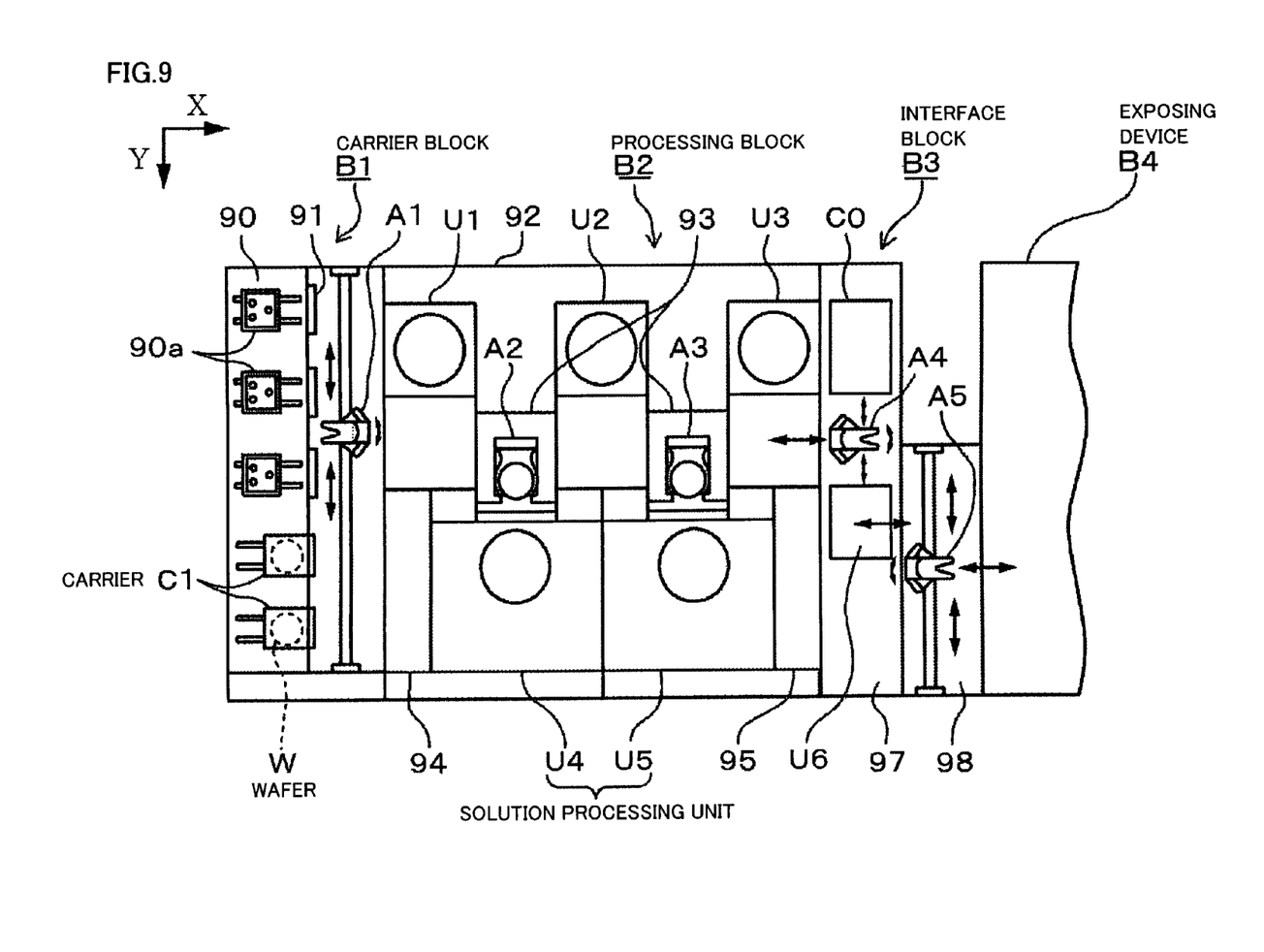
FIG. 9 is a plan of a coating and developing device employing a hydrophobic processing system.

Then, an example of the structure of the coating and developing device into which foregoing hydrophobic processing system 1 is incorporated will be described below with reference to FIGS. 9 to 11. In these figures, a carrier block B1 is arranged for transporting a carrier C1 that airtightly accommodates, e.g., 25 wafers W (i.e., substrates), and includes a carrier transfer unit 90 provided with a plurality of tables 90a on which carriers C1 can be placed, respectively, open/close units 91 arranged at a wall located downstream to carrier transfer unit 90 and transfer portion A1 for taking out wafers W from carrier C1 through open/close unit 91.

A downstream side of carrier block B1 is connected to a processing block B2 surrounded by a casing 92. In processing block B2, shelf units U1, U2 and U3 each having heating heating/cooling units in a multistage form are aligned downstream in this order, and main transport portions A2 and A3 each transferring wafer W between the processing units including coating and developing units to be described later are arranged alternately to shelf units U1, U2 and U3. Thus, shelf units U1, U2 and U3 as well as main transport portions A2 and A3 are arranged in one row extending downstream from carrier block B1, and each are provided at a connection portion with an opening (not shown) for transporting the wafer so that wafer W can freely move through processing block B2 from shelf unit U1 on one end to shelf unit U3 on the other end. Each of main transport portions A2 and A3 is located in a space surrounded by a partition 93 formed of planes of the corresponding two of shelf units U1, U2 and U3 located on the forward and rearward sides viewed downstream from carrier block B1, a plane of solution processing unit U4 or U5 (to be described later) on the right side and a plane on the left side thereof. There are also arranged temperature and humidity control units 94 and 95 that have devices for controlling the processing solution used in each unit as well as ducts and the like for controlling the temperature and humidity thereof.

Figure 10:
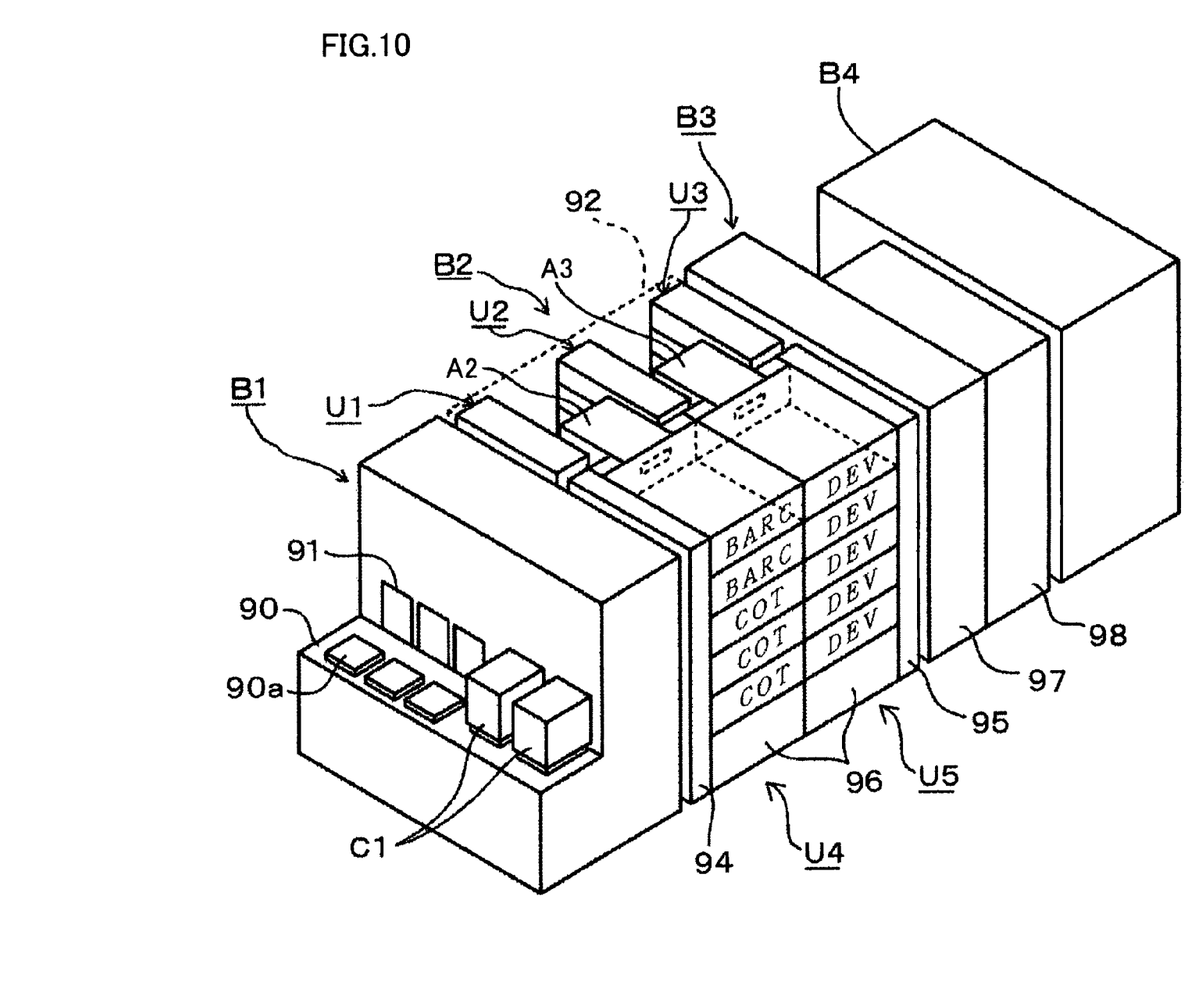
FIG. 10 is a perspective view of the coating and developing device.
Figure 11:
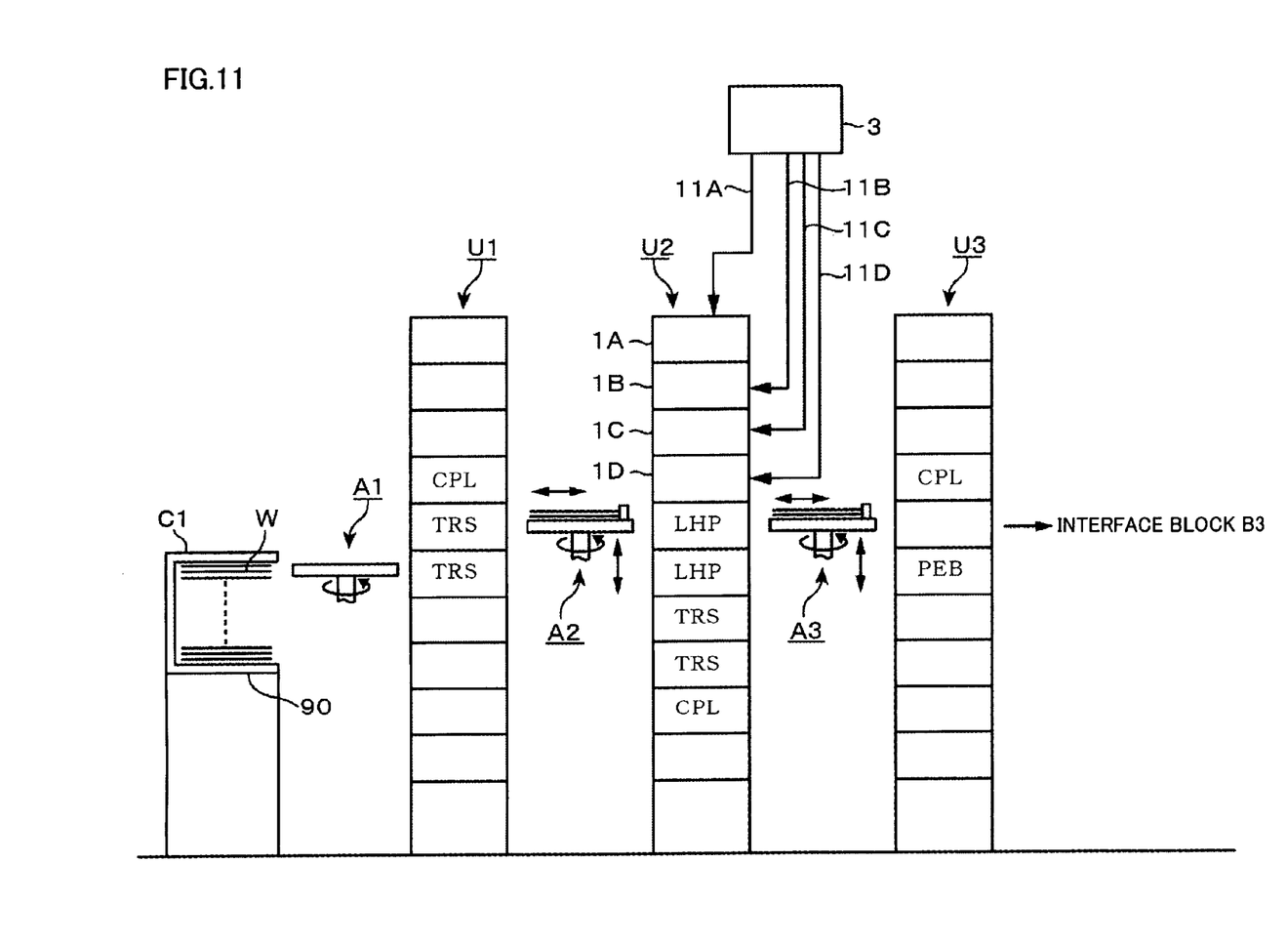
FIG. 11 is a longitudinal section of the coating and developing device.

For example, as shown in FIG. 10, each of solution processing units U4 and U5 includes a storage unit 96 that provides a space for supplying a chemical solution such as a coating solution (resist solution) or a developing solution as well as a plurality of (e.g., five) layered units such as a coating unit COT, a developing unit DEV and an antireflection film forming unit BARC. Each of shelf units U1, U2 and U3 is formed of a plurality of (e.g., ten) layered units of various types that are employed for performing pretreatment and posttreatment for the processing performed in solution processing units U4 and U5, as shown in FIG. 11. These layered units include a baking unit (LHP) baking wafer W before and after the solution processing, a cooling unit (CPL) cooling wafer W, baking unit (PEB) baking exposed wafer W and others. For example, shelf unit U2 includes hydrophobic processing modules 1A-1D already described, and foregoing HMDS solution vaporizing tank 3 is arranged near shelf unit U2. A stage TRS for transferring wafer W is also arranged.

The downstream side of shelf unit U3 in processing block B2 is connected to an exposing device B4 via an interface block B3 formed of, e.g., first and second transporting chambers 97 and 98. In interface block B3, there are arranged two transfer portions A4 and A5 as well as a shelf unit U6 for transferring wafer W between processing block B2 and exposing device B4.

Then, a flow of the wafer in this device will be described. First, when carrier C1 carrying wafer W is externally placed on table 90a, a lid of carrier C1 are removed together with open/close unit 91, and transfer portion A1 takes out wafer W. A transfer unit (not shown) forming one stage of shelf unit U1 transfers wafer W to main transport portion A2, and wafer W on the shelf in shelf units U1-U3 undergoes the pretreatment for the coating processing, i.e., the hydrophobic processing by hydrophobic processing modules 1A-1D and the cooling processing by the cooling unit (CPL), and is coated with the resist solution by coating unit COT.

Subsequently, wafer W is heated or baked by the baking unit (LHP) forming one shelf in shelf units U1-U3, then is cooled and is transported into interface block B3 through the transfer unit of shelf unit U3. In interface block B3, wafer W is transported to exposing device B4, e.g., via transfer portion A4, shelf unit U6 and transfer portion A5, and then undergoes the exposing. After the exposing, wafer W is transported to main transport portion A3 through the reverse path, and is developed by developing unit DEV to form a resist mask having a resist pattern. Thereafter, wafer W is returned to original carrier C1 on table 90a.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A chemical solution vaporizing tank for producing a processing gas by supplying a vaporization gas to a chemical solution stored in the chemical solution vaporizing tank, and supplying the processing gas to a work for performing processing, comprising:

a tank body having an internal space airtightly sealed by a partition member, the partition member laterally partitioning the internal space into a liquid level monitoring chamber and a plurality of vaporizing chambers;

a chemical solution passage formed in the partition member and located under a liquid level in the liquid level monitoring chamber and each of the vaporizing chambers for passing the chemical solution between the monitoring chamber and the vaporizing chambers;

a gas passage formed in the partition member and located above the liquid level in the liquid monitoring chamber and each of the vaporizing chambers to communicate the liquid level monitoring chamber and the vaporizing chambers with each other for uniformizing pressures in the liquid level monitoring chamber and the vaporizing chambers;

a vaporization gas supply unit arranged at each of the vaporizing chambers for supplying the vaporization gas to the chemical solution in the respective vaporizing chambers and producing the processing gas in a space above the liquid level of the chemical solution;

a processing gas takeout passage arranged for each of the vaporizing chambers for externally taking out the processing gas produced in the respective vaporizing chambers;

a chemical solution supply passage for supplying the chemical solution to the vaporizing chambers; and an atmospheric opening for exhausting the vaporizing tank to an external atmosphere, wherein the liquid level monitoring chamber is configured to isolate the liquid surface of the chemical solution in the liquid level monitoring chamber from the liquid surface of the chemical solution in the plurality of vaporizing chambers, such that there is no propagation of waves between the liquid surface in the vaporizing chambers and the liquid surface in the liquid level monitoring chamber the liquid level monitoring chamber is provided with a liquid level sensor for sensing a liquid level in the liquid level monitoring chamber in addition to the plurality of vaporizing chambers, the vaporizing tank is configured to supply the chemical solution to the vaporizing chambers based on the liquid level sensed by the liquid level sensor, the chemical solution supply passage is arranged in the liquid level monitoring chamber, and the vaporizing chambers surround the outer periphery of the liquid level monitoring chamber.

2. The chemical solution vaporizing tank according to claim 1, wherein a single chemical solution supply passage is shared among the vaporizing chambers.

3. The chemical solution vaporizing tank according to claim 2, wherein the liquid level monitoring chamber is provided with a liquid level sensor for sensing a liquid level in the liquid level monitoring chamber in addition to the plurality of vaporizing chambers; and the vaporizing tank is configured to supply the chemical solution to the vaporizing chambers based on the liquid level sensed by the liquid level sensor.

4. The chemical solution vaporizing tank according to claim 3, wherein the vaporizing chambers surround an outer periphery of the liquid level monitoring chamber.

5. The chemical solution vaporizing tank according to claim 3, wherein the chemical solution supply passage is arranged in the liquid level monitoring chamber.

6. The chemical solution vaporizing tank according to claim 5, wherein the vaporizing chambers surround an outer periphery of the liquid level monitoring chamber.

7. The chemical solution vaporizing tank according to claim 1, wherein the vaporizing chambers surround an outer periphery of the liquid level monitoring chamber.

8. A chemical solution processing system comprising:

a plurality of processing modules each having a processing space for processing a work with a processing gas;

the chemical solution vaporizing tank recited in claim 1; and a gas supply unit supplying a processing gas to each of the processing spaces via the processing gas takeout passages in the chemical solution vaporizing tank.

9. The chemical solution processing system according to claim 8, further comprising:

a controller which is configured to receive a signal from the liquid level sensor of the chemical solution vaporizing tank, and to control the supply of both the chemical solution and the vaporization gas to the chemical vaporization tank based on the signal received from the liquid level sensor.

10. The chemical solution vaporizing tank according to claim 1, wherein the vaporization gas supply units arranged only in the respective vaporizing chambers.

11. The chemical solution vaporizing tank according to claim 1, wherein the processing gas takeout passages are arranged only in the respective vaporizing chambers.

12. The chemical solution vaporizing tank according to claim 1, wherein each vaporization chamber is configured for direct fluid communication with the liquid level monitoring chamber, and direct fluid communication with at least one other vaporization chamber.

13. The chemical solution vaporizing tank according to claim 12, wherein each vaporization chamber is configured for direct fluid communication with the liquid level monitoring chamber.

* * * * *